United States Patent
Saito et al.

(10) Patent No.: US 9,559,270 B2
(45) Date of Patent: Jan. 31, 2017

(54) LIGHT-EMITTING DEVICE AND METHOD OF PRODUCING THE SAME

(71) Applicant: STANLEY ELECTRIC CO., LTD., Meguro-ku, Tokyo (JP)

(72) Inventors: Tatsuma Saito, Yokohama (JP); Satoshi Tanaka, Machida (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 14/682,680

(22) Filed: Apr. 9, 2015

(65) Prior Publication Data

US 2015/0295145 A1 Oct. 15, 2015

(30) Foreign Application Priority Data

Apr. 10, 2014 (JP) ................. 2014-081222

(51) Int. Cl.
*H01L 33/50* (2010.01)
*H01L 33/60* (2010.01)
(Continued)

(52) U.S. Cl.
CPC ......... *H01L 33/505* (2013.01); *H01L 25/0753* (2013.01); *H01L 33/46* (2013.01); *H01L 33/50* (2013.01); *H01L 33/504* (2013.01); *H01L 33/58* (2013.01); *H01L 33/60* (2013.01); *H01L 51/5253* (2013.01); *H01L 51/5271* (2013.01);
(Continued)

(58) Field of Classification Search
CPC ........ H01L 33/50; H01L 33/504; H01L 33/60; H01L 51/5253; H01L 51/5271
See application file for complete search history.

(56) References Cited

U.S. PATENT DOCUMENTS

2003/0209714 A1* 11/2003 Taskar .................. H01L 33/46
257/79
2004/0079942 A1 4/2004 Steranka et al.
(Continued)

FOREIGN PATENT DOCUMENTS

DE 102007054800 A1 4/2009
EP 1416545 A2 5/2004
(Continued)

OTHER PUBLICATIONS

Extended European Search Report dated Aug. 6, 2015, issued in counterpart European Application No. 15163199.1.

*Primary Examiner* — Phat X Cao
(74) *Attorney, Agent, or Firm* — Holtz, Holtz & Volek PC

(57) ABSTRACT

A light-emitting device can prevent light from leaking through an unwanted area (or an unintended area) and can improve color unevenness and brightness unevenness. A method of producing such a light-emitting device, can include: disposing a plurality of light-emitting elements on a surface of a supporting substrate; forming a reflecting layer on the respective light-emitting elements along peripheries of the light-emitting elements facing an area between the light-emitting elements; forming a wavelength conversion layer so as to embed the plurality of light-emitting elements therein on the supporting substrate; and irradiating the wavelength conversion layer with laser beams to remove the wavelength conversion layer disposed at the area between the light-emitting elements.

6 Claims, 10 Drawing Sheets

(51) Int. Cl.
*H01L 51/52* (2006.01)
*H01L 33/46* (2010.01)
*H01L 25/075* (2006.01)
*H01L 33/58* (2010.01)
*H01L 27/15* (2006.01)
*H01L 33/00* (2010.01)

(52) U.S. Cl.
CPC ........ *H01L 27/156* (2013.01); *H01L 33/0079* (2013.01); *H01L 33/508* (2013.01); *H01L 2924/0002* (2013.01); *H01L 2933/0025* (2013.01); *H01L 2933/0041* (2013.01)

(56) References Cited

U.S. PATENT DOCUMENTS

| | | |
|---|---|---|
| 2004/0080251 A1 | 4/2004 | Steranka et al. |
| 2006/0049548 A1 | 3/2006 | Auburger et al. |
| 2010/0105156 A1 | 4/2010 | Chen et al. |
| 2010/0295079 A1 | 11/2010 | Melman |
| 2013/0320371 A1* | 12/2013 | Sugizaki ................ H01L 33/62 257/98 |
| 2014/0186979 A1* | 7/2014 | Tu ........................... H01L 33/52 438/27 |

FOREIGN PATENT DOCUMENTS

| | | |
|---|---|---|
| EP | 1630913 A1 | 3/2006 |
| JP | 2011165827 A | 8/2011 |

\* cited by examiner

LIGHT-EMITTING DEVICE AND METHOD OF PRODUCING THE SAME

This application claims the priority benefit under 35 U.S.C. §119 of Japanese Patent Application No. 2014-081222 filed on Apr. 10, 2014, which is hereby incorporated in its entirety by reference.

TECHNICAL FIELD

The present invention relates to light-emitting devices, and in particular, to a light-emitting device incorporating light-emitting diodes (LED) therein and a method of producing the same.

BACKGROUND ART

Light-emitting devices incorporating an LED element have conventionally been utilized in the field of illumination, backlighting, industrial devices, etc. One example of such light-emitting devices can be a light-emitting device described in Japanese Patent Application Laid-Open No. 2011-165827, in which a plurality of LED elements are arranged on a supporting substrate and a phosphor resin layer is formed to cover the LED elements and fill in the area between the LED elements. This configuration can allow the light-emitting device to emit white light.

When a plurality of light-emitting elements are arranged on a single supporting substrate like the light-emitting device described in Japanese Patent Application Laid-Open No. 2011-165827 for light emission, the light can be propagated through the phosphor resin layer disposed between the light-emitting elements. Due to this, a problem may arise in which light may leak from areas that should not serve as an area for light emission.

SUMMARY

The present invention was devised in view of these and other problems and features in association with the conventional art. According to an aspect of the present invention, a light-emitting device incorporating light-emitting elements such as LEDs therein and a phosphor resin layer can be produced by removing the phosphor resin layer disposed in between the light-emitting elements without damaging the light-emitting elements to thereby prevent the light from leaking through an unwanted area (or an unintended area) and to provide a light-emitting device with improved color unevenness and brightness unevenness. Also, according to another aspect of the present invention, a method of producing a light-emitting device can provide such an improved light-emitting device.

According to another aspect of the present invention, the method of producing a light-emitting device can include: disposing a plurality of light-emitting elements on a surface of a supporting substrate; forming a reflecting layer on the respective light-emitting elements along peripheries of the light-emitting elements facing an area between the light-emitting elements; forming a wavelength conversion layer so as to embed the plurality of light-emitting elements therein on the supporting substrate; and irradiating the wavelength conversion layer with laser beams to remove the wavelength conversion layer disposed at the area between the light-emitting elements.

In the method of producing a light-emitting device with the above configuration, the reflecting layer may include a first reflecting layer and a second reflecting layer. Furthermore, forming the reflecting layer may include: forming the first reflecting layer on each of the plurality of light-emitting elements, the first reflecting layer configured to reflect light emitted from the light-emitting element; and forming the second reflecting layer on the first reflecting layer, the second reflecting layer configured to reflect the laser beams.

In the method of producing a light-emitting device with the above configuration, forming the reflecting layer may further include forming an adhesion layer on the first reflecting layer, the adhesion layer configured to adhere the first reflecting layer and the second reflecting layer to each other.

In the method of producing a light-emitting device with the above configuration, forming the reflecting layer may further include forming a protective layer on the second reflecting surface.

According to still another aspect of the present invention, the light-emitting device can include: a supporting substrate: a plurality of light-emitting elements arranged on the supporting substrate; a wavelength conversion layer configured to cover the respective light-emitting elements; and a reflecting layer disposed on the respective light-emitting elements along peripheries of the light-emitting elements facing an area (or inter-element area) between the light-emitting elements.

In the light-emitting device with the above configuration, the reflecting layer may include a first reflecting layer and a second reflecting layer, the first reflecting layer is configured to reflect light emitted from the light-emitting element, and the second reflecting layer is configured to reflect a laser beam with a predetermined wavelength.

BRIEF DESCRIPTION OF DRAWINGS

These and other characteristics, features, and advantages of the present invention will become clear from the following description with reference to the accompanying drawings, wherein.

DESCRIPTION OF EXEMPLARY EMBODIMENTS

Figure 1:
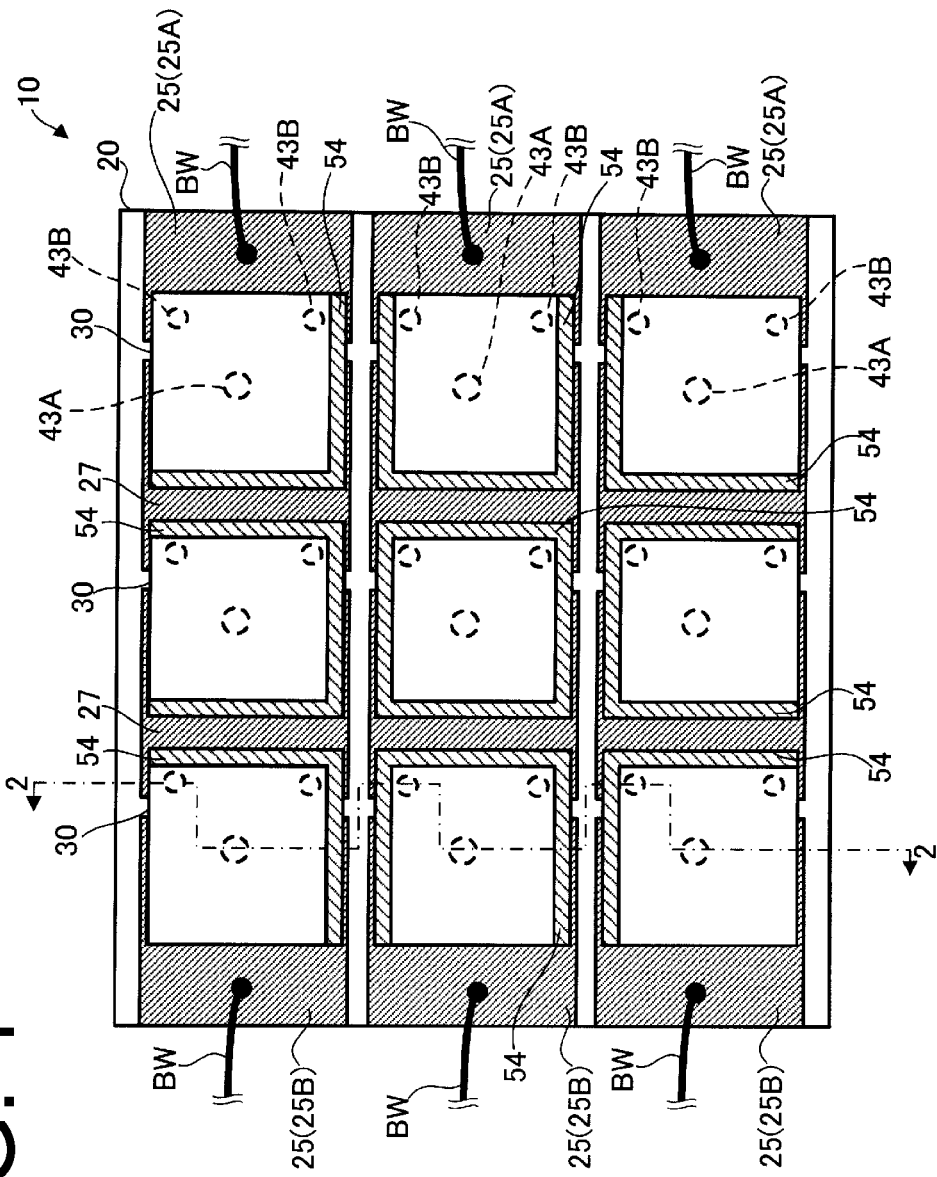
FIG. 1 is a top plan view of an exemplary embodiment of a light-emitting device made in accordance with principles of the present invention.

A description will now be made below to light-emitting devices made in accordance with the principles of the present invention with reference to the accompanying drawings in accordance with exemplary embodiments.

In order to facilitate the explanation and the understanding, a description will be made to the exemplary embodiments that can include a first semiconductor layer, a light-emitting layer, and a second semiconductor layer as a semiconductor structure layer. However, the present invention is not limited thereto, and the first semiconductor layer and the second semiconductor layer, and the light-emitting layer may each be constituted by a plurality of layers. Furthermore, such a semiconductor layer can include various functional layers, such as a carrier injection layer, a barrier layer for preventing carrier overflow, a current diffusion layer, a contact layer for improving ohmic contact, and a buffer layer. The conductive type of the first and second semiconductor layers can also be appropriately selected in accordance with the intended purpose. Therefore, the conductivity type may be opposite conductivity to those used in the exemplary embodiments.

In the following description, preferred exemplary embodiments of the present invention will be given, which may be appropriately modified or may be combined with one another. In the following description and the accompanying drawings, the same or similar parts may be denoted by the same reference numerals for illustration.

First, a light-emitting device as one exemplary embodiment of the present invention will be described with reference to FIG. 1 and FIG. 2. In the following exemplary embodiment, a description will be given of the light-emitting device that can include nine light-emitting elements arranged on a base in a 3×3 matrix form, as one exemplary embodiment, but the present invention is not limited thereto.

Figure 2:
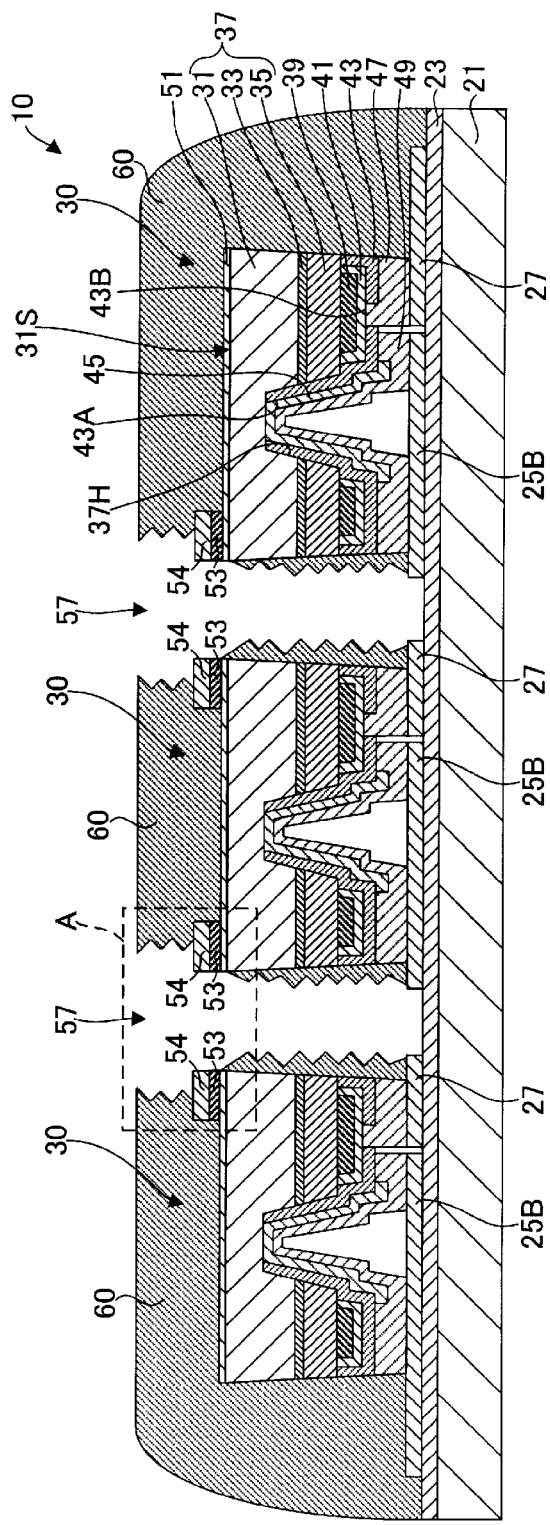
FIG. 2 is a cross-sectional view of the light-emitting device taken along line 2-2 in FIG. 1.

FIG. 1 is a top plan view of a light-emitting device made in accordance with the principles of the present invention, and FIG. 2 is a cross-sectional view of the light-emitting device taken along line 2-2 in FIG. 1.

As illustrated in FIG. 1 and FIG. 2, the light-emitting device 10 can include a base 20, a plurality (for example, nine in this exemplary embodiment) of light-emitting elements 30, and a wavelength conversion layer 60. The light-emitting elements 30 can be arranged on the base 20 in a 3×3 matrix form. The wavelength conversion layer 60 can be configured to cover the light-emitting elements 30, as illustrated in FIG. 2. Part of the wavelength conversion layer 60 at areas between the adjacent light-emitting elements 30 may be removed, so that the wavelength conversion layer 60 can be discontinuously provided on the base 20. Note that, in FIG. 1, the wavelength conversion layer 60 is not illustrated in order to clearly illustrate the upper side structure including the base 20 and the light-emitting elements 20.

The base 20 can include a supporting substrate 21, an insulating layer 23, wiring electrodes 25, and connection electrodes 27. The supporting substrate 21 can be composed of a substrate having favorable heat dissipation properties, such as a Si substrate, and can have a rectangle shape when viewed from above. The insulating layer 23 can be a layer formed from $SiO_2$, for example, on the surface that faces the light-emitting element 30, or an element-mounting surface of the supporting substrate 21.

The wiring electrodes 25 can serve as a first bonding layer formed on the insulating layer 23, and can be composed of three sets of metal electrodes disposed at respective end portions of the base 20. The metal electrode may be made of Au or other metals. For example, one set of the wiring electrodes 25 can be composed of a p-wiring electrode 25A disposed at one end portion of the base 20 (at the right side end area in FIG. 1) and an n-wiring electrode 25B disposed at the other end portion of the base 20 (at the left side end area in FIG. 1). Each of the wiring electrodes 25A and 25B can be connected to a not-illustrated external power terminal with a bonding wire BW as illustrated in FIG. 1.

On the insulating layer 23 between the pair of the p-wiring electrode 25A and the n-wiring electrode 25B as one set, two connection electrodes 27 can be disposed side by side while being separated from the p-wiring electrode 25A and the n-wiring electrode 25B. The connection electrodes 27 can also serve as the first bonding layer and be separated from each other. Thus, the adjacent light-emitting elements 30 arranged between one set of the p-wiring electrode 25A and the n-wiring electrode 25B can be electrically connected by the connection electrodes 27 in series.

The three light-emitting elements 30 are arranged in line along a virtual straight line between each one pair of the pairs of the p-wiring electrode 25A and the n-wiring electrode 25B on the base 20, so that the light-emitting elements 30 can be electrically connected in series. Accordingly, the set of three light-emitting elements 30 connected in series between the pair of the p-wiring electrode 25A and the n-wiring electrode 25B can be turned on or off.

The light-emitting element 30 can be a GaN-based light-emitting diode (LED) $(Al_xIn_yGa_{1-x-y}N$ wherein $0 \leq x \leq 1$ and $0 \leq y \leq 1)$.

Specifically, the light-emitting element 30 can have a semiconductor structure layer 37 serving as a light-emitting functional layer. The semiconductor structure layer 37 can be configured by stacking a first semiconductor layer 31 of a first conductivity type, a light-emitting layer 33, and a second semiconductor layer 35 of a second conductivity type which is opposite conductivity to the first conductivity type. The illustrated exemplary embodiment deals with an exemplary case where the first semiconductor layer 31 is an n-type semiconductor layer and the second semiconductor layer 32 is a p-type semiconductor layer.

Specifically, the first semiconductor layer 31 can be a layer including an n-type semiconductor layer doped with an n-type dopant, such as Si. The light-emitting layer 33 can have a multiple quantum well structure configured by repeatedly stacking a GaN layer and an $In_xGa_{1-x}N$ layer (wherein $0 \leq x \leq 1$). The second semiconductor layer 35 can be a p-type semiconductor layer doped with a p-type dopant such as Mg. The first semiconductor layer 31 can have a surface 31S that serves as a light emission surface (being a top surface of the semiconductor structure layer 37).

A hole 37H can be formed from the second semiconductor layer 35 to the first semiconductor layer 31 through the light-emitting layer 33 at the center bottom surface of the semiconductor structure layer 37.

On the lower surface of the second semiconductor layer 35, there is formed a p-electrode 39 that can be configured by stacking Ti/Ag or ITO/Ag in this order. A cap layer 41 can be formed to bury the p-electrode 39 on the lower surface of the second semiconductor layer 35. The cap layer 41 can be a layer configured by stacking TiW/Ti/Pt/Au/Ti in this order. Note that the cap layer 41 may be formed from another material such as Ti, W, Pt, Pd, Mo, Ru, Ir, Au, and an alloy thereof provided that the cap layer 41 can prevent the materials of the p-electrode 39 from being diffused. Furthermore, the cap layer 41 may be formed from a layered structure of Ag/TiW/Ti/Pt/Au/Ti in this order in order to enhance the light reflectivity of the cap layer 41.

The insulating layer 43 can be a layer having insulation properties and formed to cover the exposed surface of the semiconductor structure layer 37 and the cap layer 41. The insulating layer 43 can be formed from $SiO_2$, SiN, etc., for example. The insulating layer 43 can have an opening 43A and two openings 43B, the opening 43A exposing the first semiconductor layer 31 exposed at the bottom of the hole 37H and the opening 43B exposing the cap layer 41 in an area of one end side of the light-emitting element 30.

The n-electrode 45 can be formed to cover the surface of the first semiconductor layer 31 exposed through the opening 43A at the bottom of the hole 37H and the surface of the insulating layer 43 formed over the inner peripheral surface of the hole 37H. The n-electrode 45 can be a layer formed by depositing Ti/Al or Ti/Ag in this order from the surfaces of the first semiconductor layer 31 and the insulating layer 43. Consequently, the n-electrode 45 can electrically connect with the first semiconductor layer 31 at the opening 43A.

A p-power supply electrode 47 serving as a second bonding layer can be formed to cover the cap layer 41 exposed through the opening 43B. The p-power supply electrode 47 can be formed by stacking Ti/Pt/Au in this order. An n-power supply electrode 49 serving also as the second bonding layer can be formed to cover the insulating layer 43 and the n-electrode 45 in an area other than the area of the one end side where the p-power supply electrode 47 is formed. The n-power supply electrode 49 can be formed by stacking Ti/Pt/Au in this order. The n-power supply electrode 49 can be separated from the p-power supply electrode 47 so as to be electrically isolated from the p-power supply electrode 47.

The p-power supply electrodes 47 of the three light-emitting elements 30 disposed on the leftmost side in FIG. 1 can be connected to the connection electrodes 27 of the base 20 while the n-power supply electrodes 49 thereof can be connected to the n-wiring electrodes 25B, respectively. Specifically, in the light-emitting element 30, the power supply to the semiconductor structure layer 37 can be achieved from the p-power supply electrodes 47 and the n-power supply electrodes 49 through the p-electrode 39 and the n-electrode 45. Note that the p-power supply electrodes 47 and the n-power supply electrodes 49 of the three light-emitting elements 30 at the horizontal center in FIG. 1 are connected to the corresponding connection electrodes 27, respectively. The n-power supply electrodes 49 of the three light-emitting elements 30 disposed on the rightmost side in FIG. 1 can be connected to the connection electrodes 27 while the p-power supply electrodes 47 thereof can be connected to the p-wiring electrodes 25A, respectively.

On the surface 31S of the semiconductor structure layer 37, an insulation protective film 51 serving as a light-transmitting insulation layer can be formed. The film 51 can be made of $SiO_2$ and have a film thickness of 350 nm, for example. Further on the top surface of the insulation protective film 51, formed are a first reflecting layer 53 and a second reflecting layer 54 in this order.

The first reflecting layer 53 can be a layer formed from Ag having a high reflectance with respect to light with the emission wavelength (for example, 450 nm) of the light-emitting element 30. The second reflecting layer 54 can be a layer formed from Al having a high reflectance with respect to light with the emission wavelength (for example, 355 nm) of laser beams used for removal of portions of the wavelength conversion layer 60, to be described later. The first reflecting layer 53 and the second reflecting layer 54 can be formed along the peripheries of the light-emitting elements 30 facing the area 57 (inter-element area) between the adjacent light-emitting elements 30, as illustrated in FIG. 2. Consequently, the first and second reflecting layers 53 and 54 are not formed in an area not adjacent to the light-emitting elements 30, among areas along the peripheries of the top surface of the light-emitting elements 30 (peripheral area).

The first reflecting layer 53 can be made of a metal such as Al, Rh, Pt, etc., so long as the material has high reflectance with respect the light with the emission wavelength of the light-emitting element 30. The second reflecting layer 54 can be made of a metal such as Ag, Rh, Pt, etc., so long as the material has high reflectance with respect to the light with the emission wavelength of the laser beams for use in removal of the wavelength conversion layer 60.

The wavelength conversion layer 60 can be a member including a silicone binder resin cured and, for example, YAG phosphor ($Y_3Al_5O_{12}:Ce^{3+}$) particles dispersed in the binder resin. The wavelength conversion layer 60 can be formed to cover the top surface of the base 20 and the light-emitting element 30 while being discontinuous and separated from each other at the inter-element areas 57 between the adjacent light-emitting elements 30. Specifically, the wavelength conversion layer 60 can be removed at the inter-element areas between the adjacent light-emitting elements 30. Consequently, the wavelength conversion layer 60 can be separated to form pieces of the wavelength conversion layer 60 each independently covering the light-emitting element 30 corresponding thereto.

Figure 3:
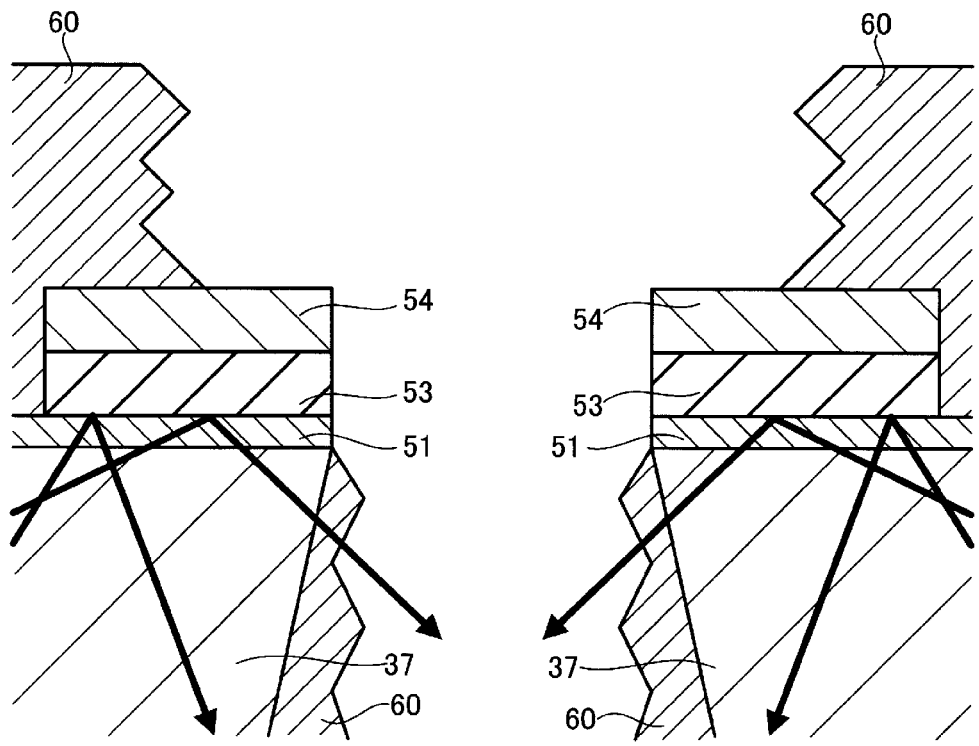
FIG. 3 is an enlarged view of a part of the light-emitting device of FIG. 2.

FIG. 3 is an enlarged view of the part A of the light-emitting device of FIG. 2 surrounded by a dashed line. FIG. 3 illustrates a case where the light emitted from the light-emitting layer 33 travels the layers as shown by thick arrows when the light-emitting device 10 is supplied with a driving current. As illustrated in FIG. 3, the light emitted from the light-emitting layer 33 can be reflected on the surface of the first reflecting layer 53 downward, or toward the base 20.

[Production Method of Light-Emitting Device 10]

A description will now be given of the method of producing the light-emitting device 10 according to the exemplary embodiment in detail. FIGS. 4 to 9 are each a cross-sectional view illustrating each of the production steps for producing the light-emitting device 10 illustrated in FIG. 1. The illustrated cross-sectional views of FIGS. 4 to 9 are the same section taken along the cut line 2-2 in FIG. 1.

[Formation of Light-Emitting Element]

First, the semiconductor structure layer 37 can be formed by performing crystal growth using a metal-organic chemical vapor deposition (MOCVD) method. Specifically, a growth substrate 61 such as a sapphire substrate is loaded to an MOCVD apparatus. After thermal cleaning, the first semiconductor layer 31, the light-emitting layer 33, and the second semiconductor layer 35 are deposited in this order. In this exemplary embodiment, a description is given of the case where the first semiconductor layer 31 is an n-type semiconductor layer and the second semiconductor layer 35 is a p-type semiconductor layer having opposite conductivity to that of the first semiconductor layer.

Figure 4:
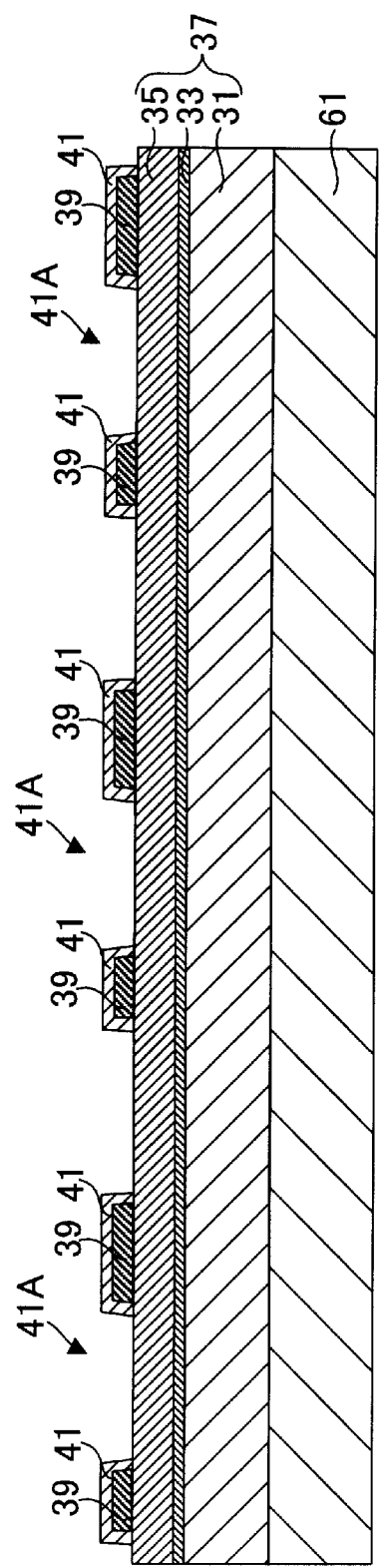
FIG. 4 is a cross-sectional view illustrating one step of the production steps for producing the light-emitting device shown in FIG. 1.

Next, as illustrated in FIG. 4, the p-electrode 39 and the cap layer 41 are formed. The p-electrode 39 can be formed by depositing Ti/Ag or ITO/Ag in this order on the second semiconductor layer 35 by a sputtering method or an electron beam (EB) evaporation method to have a thickness of about 100 nm to about 300 nm, followed by patterning the layers to a predetermined form, so that the second semiconductor layer 35 is exposed at the portion where to form the hole 37H.

The cap layer 41 can be formed by depositing TiW (film thickness: 250 nm)/Ti (film thickness: 50 nm)/Pt (film thickness: 100 nm)/Au (film thickness: 1000 nm)/Ti (film thickness: 300 nm) in this order by a sputtering method or an EB evaporation method so as to embed the p-electrode 39, followed by patterning the layers in the same manner as that for the p-electrode. This process can form an exposed face 41A through which the second semiconductor layer 35 is exposed after the formation of the cap layer 41. The cap layer 41 can be formed from any of Ti, W, Pt, Pd, Mo, Ru, Ir, Au, and alloys thereof, and the like materials. Further, in order to enhance the reflectivity of the cap layer 41, an Ag layer may be formed first as the lowermost layer.

Figure 5:
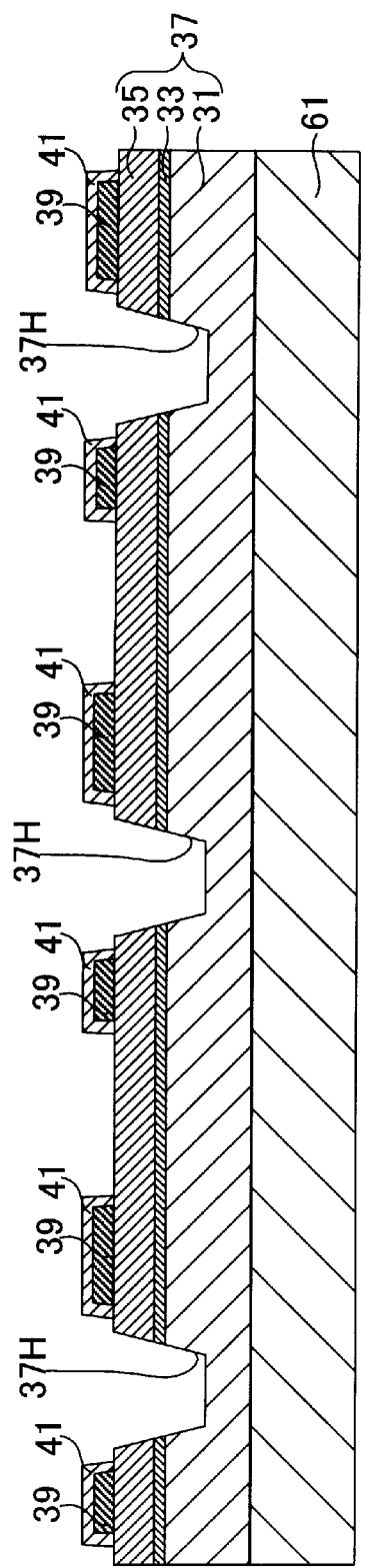
FIG. 5 is a cross-sectional view illustrating another step of the production steps for producing the light-emitting device shown in FIG. 1.

Next, the hole 37H is formed in the first semiconductor layer 31 as illustrated in FIG. 5. Specifically, the hole 37H can be formed through the second semiconductor layer 35, which is exposed at the exposed face 41A where the p-electrode 39 and the cap layer 41 are removed by patterning, and the light-emitting layer 33 so as to expose the first semiconductor layer 31. The hole 37H can be formed, for example, by dry etching such as reactive ion etching (RIE) of the second semiconductor layer 35 and the light-emitting layer 33.

Figure 6:
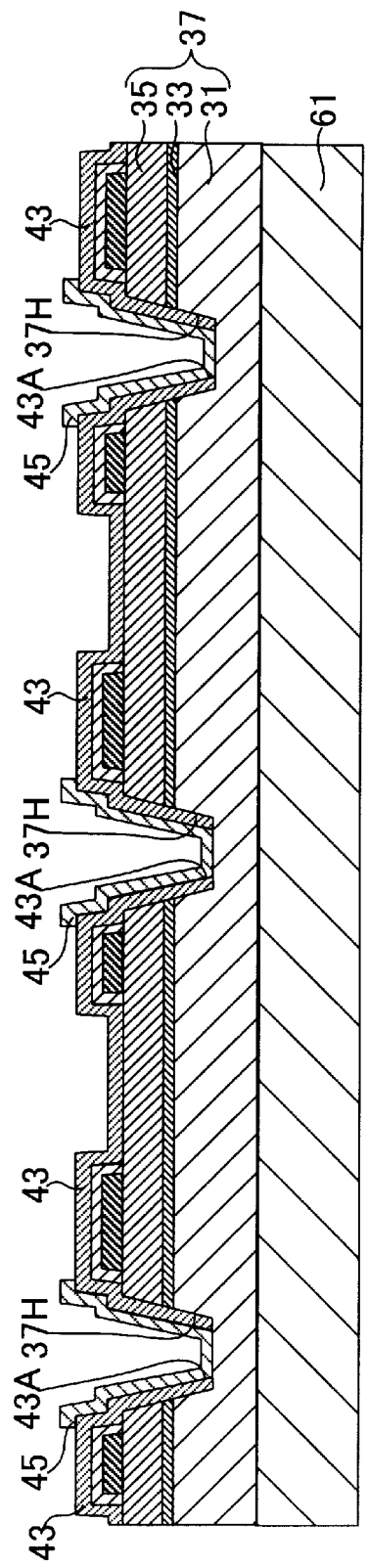
FIG. 6 is a cross-sectional view illustrating still another step of the production steps for producing the light-emitting device shown in FIG. 1.

Next, as illustrated in FIG. 6, the insulating layer 43 and the n-electrode 45 are formed. Specifically, an insulating material such as $SiO_2$ or SiN can be deposited by a sputtering method or a chemical vapor deposition (CVD) method to cover the surface of the second semiconductor layer 35, the cap layer 41, etc., to thereby form the insulating layer 43 having the opening 43A through which the first semiconductor layer 31 is exposed.

After that, the n-electrode 45 is formed to cover the surface of the first semiconductor layer 31 exposed through the opening 43A at the bottom of the hole 37H as well as the portion of the insulating layer 43 formed over the inner peripheral surface of the hole 37H. The n-electrode 45 can be formed by depositing Ti/Al or Ti/Ag in this order from the surface of the first semiconductor layer 31 to have a thickness of, for example, 500 nm or larger, and then patterning the layers.

Figure 7:
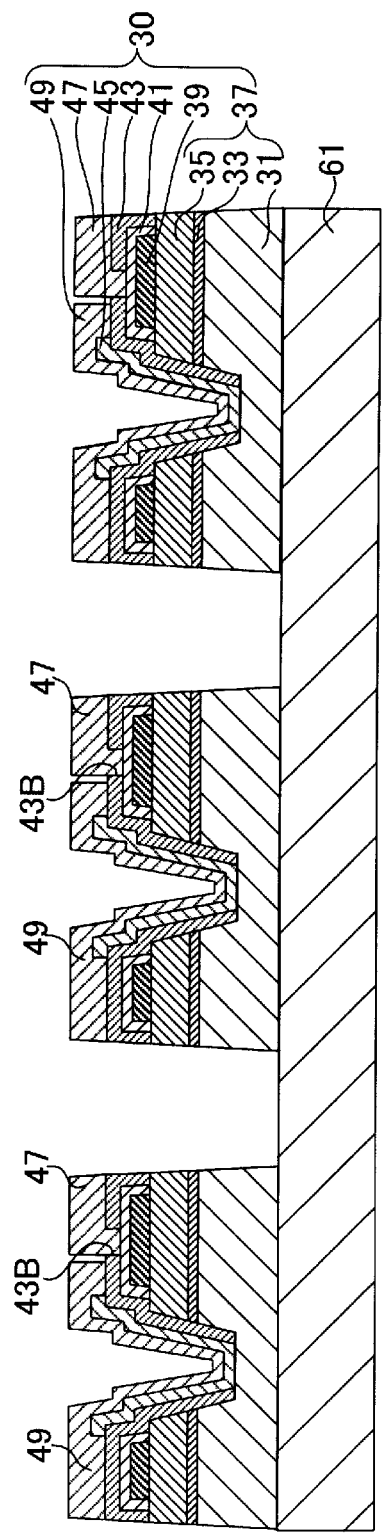
FIG. 7 is a cross-sectional view illustrating further another step of the production steps for producing the light-emitting device shown in FIG. 1.

Next, as illustrated in FIG. 7, the p-power supply electrode 47 and the n-power supply electrode 49 are formed and each of the light-emitting elements 30 is separated from each other. Specifically, the p-power supply electrode 47 and the n-power supply electrode 49 can be formed by first depositing Ti/Pt/Au in this order by an EB evaporation method to cover the insulating layer 43 and the n-electrode 45 and also the cap layer 41 exposed through the opening 43B, and then patterning the same to a predetermined shape. In this case, the patterning should be performed so that the n-power supply electrode 49 is electrically isolated from the p-power supply electrode 47. After that, for example, dry etching is performed to form grooves reaching the growth substrate 61, so that the light-emitting elements 30 are individually segmented.

[Formation of Base and Bonding to Base]

First, the insulating layer 23 formed from $SiO_2$ or SiN is formed on one surface of the supporting substrate 21 formed from Si, for example. After that, the p-wiring electrodes 25A, n-wiring electrodes 25B, and connection electrodes 27 are formed on the insulating layer 23 from Au (see FIG. 1). These electrodes 25A, 25B, and 27 can also function as a bonding layer with the light-emitting elements 30. This can complete the base 20. The formation of the p-wiring electrodes 25A, n-wiring electrodes 25B, and connection electrodes 27 can be performed using an appropriate technique such as a resistive heating method, an EB evaporation method, a sputtering method, etc.

Next, the base 20 and the light-emitting elements 30 can be bonded by means of thermal-compression bonding. Specifically, Au exposed on the topmost layers of the p-power supply electrodes 47 and the n-power supply electrodes 49 of the light-emitting elements 30 and Au forming the p-wiring electrodes 25A, n-wiring electrodes 25B, and connection electrodes 27 can be subjected to thermal-compression bonding, thereby performing formation of, so-called, Au/Au junction. The bonding method and material are not limited to the above-described method and the materials, but may be achieved by eutectic bonding of AuSn, or the like.

[Removal of Growth Substrate]

After the bonding between the base 20 and the light-emitting elements 30, the growth substrate 61 is removed. The surface 31S of the first semiconductor layer 31 can be exposed by the removal of the growth substrate 61, and can serve as a light emission surface. The growth substrate 61 can be removed by a laser lift-off method, for example. Examples of other removal methods may include a wet etching method, a dry etching method, a mechanical polishing method, a chemical mechanical polishing (CMP) method, and combinations including at least one of them.

[Formation of Insulation Protective Film]

After the removal of the growth substrate 61, the insulation protective film 51 is formed on the surface 31S of the first semiconductor layer 31 exposed by the removal of the growth substrate 61. The insulation protective film 51 has light-transmitting properties. Specifically, the insulation protective film 51 can be formed by, for example, a CVD method to deposit $SiO_2$ with a film thickness of 350 nm.

[Formation of Reflecting Layers]

Figure 8:
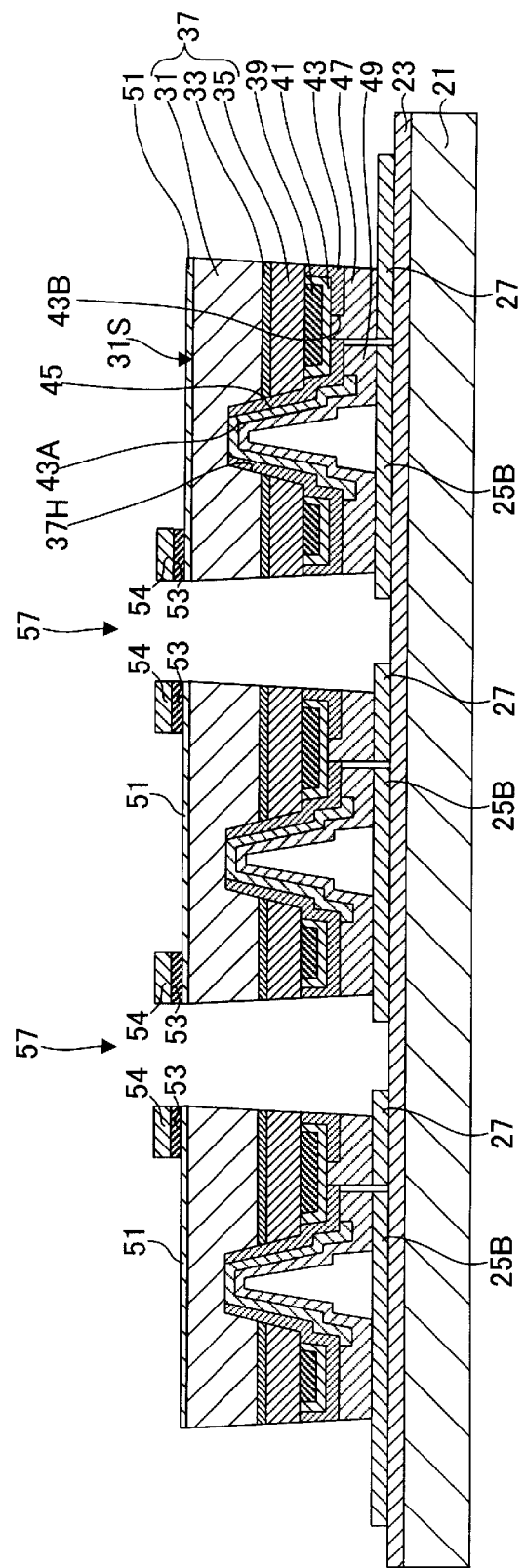
FIG. 8 is a cross-sectional view illustrating still another step of the production steps for producing the light-emitting device shown in FIG. 1.

After the formation of the insulation protective film 51, as illustrated in FIG. 8, the first reflecting layer 53 for reflecting the light emitted from the light-emitting layer 33 and the second reflecting layer 54 for reflecting the laser beams for use in removal of the phosphor material during the formation of the later-described wavelength conversion layer 60 can be formed. Specifically, the first reflecting layer 53 can be formed by depositing an Ag layer along the peripheries of the top surface of the light-emitting elements 30 facing an inter-element area 57 between the adjacent light-emitting elements 30 by an EB evaporation method. The formed Ag layer can have a layer thickness of 200 nm. Consequently, the first reflecting layers 53 are not formed in an area not adjacent to the light-emitting elements 30, among areas along the peripheries of the top surface of the light-emitting elements 30 (peripheral area). (See FIG. 1.)

Then, the second reflecting layer 54 can be formed on the first reflecting layer 53 by depositing an Al layer of 500 nm by an EB evaporation method. The first and second reflecting layers 53 and 54 may be formed by any appropriate method other than the EB evaporation method, such as a sputtering method. The first and second reflecting layers 53 and 54 should preferably be formed so as to be in contact with the upper surface end edge of the insulation protective film 51, i.e., so as to cover the end edge of the insulation protective film 51. This is preferable from the viewpoint of protecting the semiconductor structure layer 37 when removing the phosphor material by laser beams, to be described later. Note that an additional insulation protective film may be provided on the second reflecting layer 54.

[Bonding]

After forming the reflecting layers 53 and 54, the base 20 is mounted on a mounting board (not illustrated), and the p-wiring electrode 25A and the n-wiring electrode 25B are connected to power supply terminals of the mounting board by means of bonding wire BW (see FIG. 1).

[Formation of Wavelength Conversion Layer]

Figure 9:
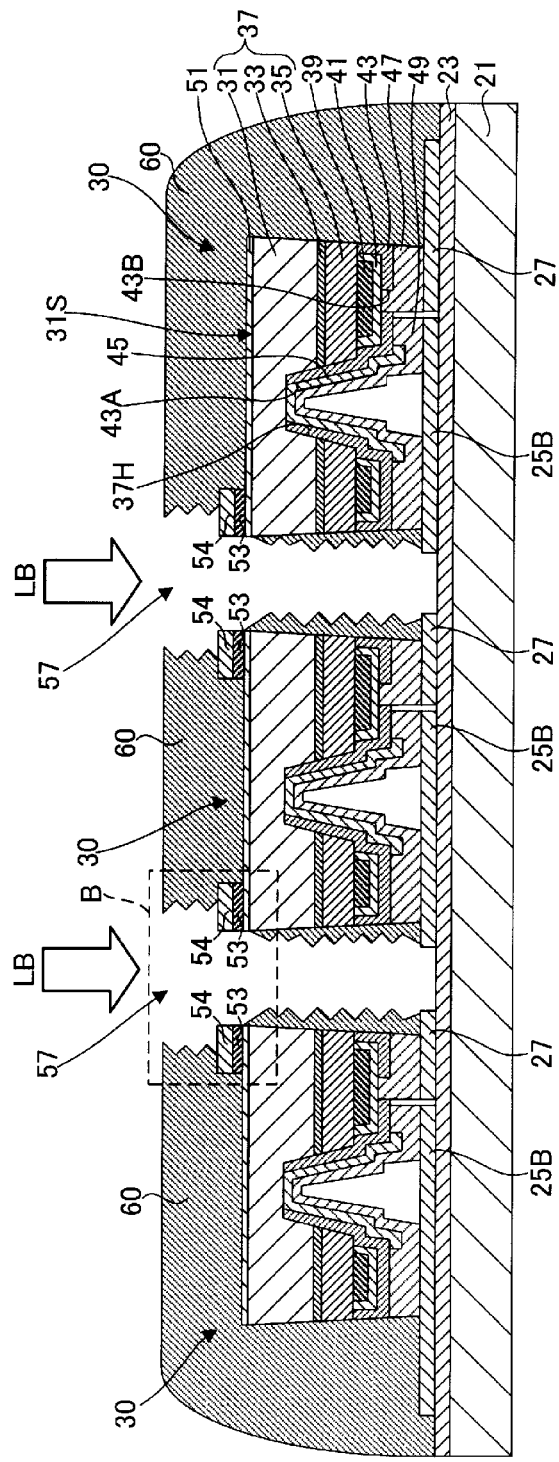
FIG. 9 is a cross-sectional view illustrating still further another step of the production steps for producing the light-emitting device shown in FIG. 1.

After bonding, the wavelength conversion layer 60 is formed as illustrated in FIG. 9. Specifically, first, a phosphor material is disposed by application or potting from above the light-emitting elements 30 so as to embed the light-emitting elements 30 on the base 20. Herein, the phosphor material can contain YAG phosphor particles and a silicone resin. Then, the silicone resin is heated to be cured. After curing the silicone resin, the inter-element area 57 between the adjacent light-emitting elements 30 can be irradiated with laser beams LB of a wavelength of 335 nm and an output of about 3 W (illustrated by a hollow arrow in the drawings) to thereby remove the phosphor material from the inter-element area 57. This can complete the formation of the wavelength conversion layer 60.

Figure 10:
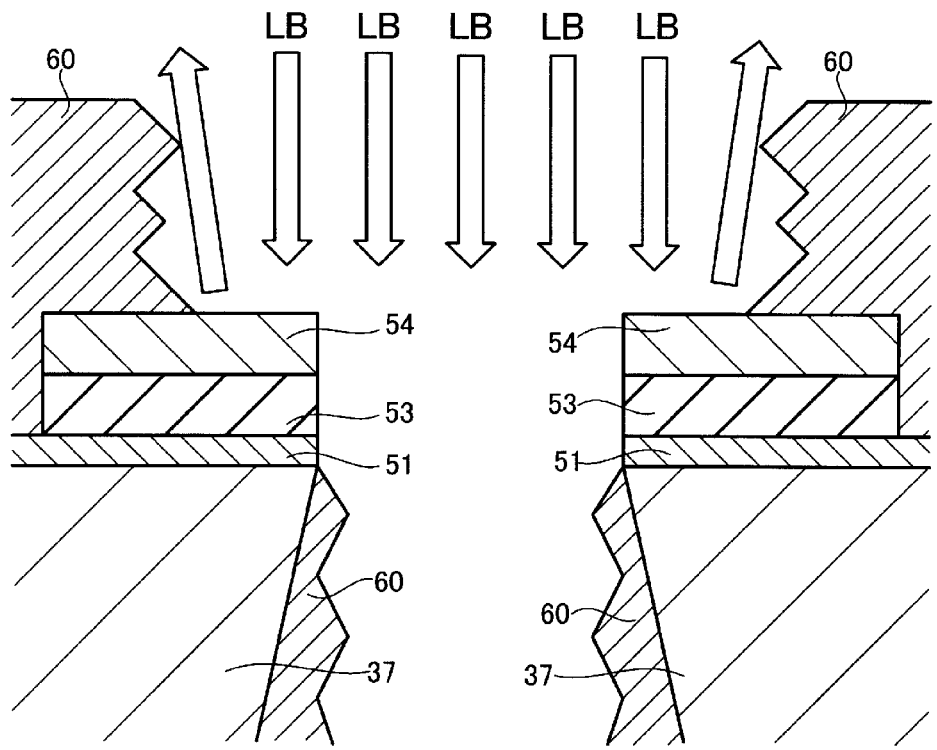
FIG. 10 is an enlarged view of a part of the light-emitting device of FIG. 9.

FIG. 10 is an enlarged view of the part B of the light-emitting device of FIG. 9. In FIG. 10, the laser beams LB to be irradiated for removal of the phosphor material is represented by the hollow arrow. As illustrated in FIG. 10, the laser beams LB projected toward the inter-element area but shifted to reach the top of the light-emitting elements 30 can be reflected by the second reflecting layer 54. Consequently, the semiconductor structure layer 37 can be prevented from being directly irradiated with the laser beams during the removal step of the phosphor material when formation of the wavelength conversion layer 60. This means that the semiconductor structure layer 37 can be prevented from being damaged during the removal step of the phosphor material.

Conventionally, the cross-talk phenomenon occurs, in which the light emitted from the respective light-emitting elements 30 is propagated through the wavelength conversion layer and leak to the peripheral areas of the respective light-emitting elements 30, whereby the light may be spread to the inter-element area or areas of the adjacent light-emitting elements 30. According to the light-emitting device and the production method thereof as illustrated in the exemplary embodiment, the area (inter-element area) between the adjacent light-emitting elements 30 does not contain any wavelength conversion layer. With the configuration of the present invention, this cross-talk phenomenon can be prevented.

Furthermore, even when the phosphor material on the peripheries of the top surface of the light-emitting elements 30 is removed at the time of removal of the phosphor material for the formation of the wavelength conversion layer 60 to thereby expose the second reflecting layer 54 through the wavelength conversion layer 60, for example, blue excitation light from the light-emitting layer 33 can be reflected on the lower surface of the first reflecting layer 53, as illustrated in FIG. 3. Therefore, the blue excitation light emitted from the light-emitting layer 33 can be prevented from being projected directly outside of the light-emitting device 10 via the peripheral edge of the top surface of the light-emitting element 30 without being incident on the wavelength conversion layer 60. This configuration can prevent the color unevenness from being generated at the peripheral edge of the top surface of the light-emitting element 30.

In the above-described exemplary embodiment, an irregular structure may be formed on the surface 31S (light emission surface) of the first semiconductor layer 31 in order to improve the light extraction efficiency. Such an irregular structure can be formed by, after removing the growth substrate 61, subjecting the surface 31S of the first semiconductor layer 31 to an anisotropic wet etching treatment using TMAH to form a light extraction surface. Furthermore, such an irregular structure can be formed also by forming a mask pattern having an artificial cyclic structure by a method such as photolithography, EB lithography, nanoimprinting, laser exposure, etc., and a lift-off method, and then performing dry etching.

In the above-described exemplary embodiment, the second reflecting layer 54 is formed to be in contact with the surface of the first reflecting layer 53, but it is not limitative. An additional layer (adhesion layer) with high adhesion, made of Ti or Ni, can be formed between the first reflecting layer 53 and the second reflecting layer 54. By doing so, the adhesion between the first reflecting layer 53 and the second reflecting layer 54 can be improved to prevent them from being detached from each other, thereby resulting in improvement of the production yield of the light-emitting device.

Further, as described above, an additional insulation protective film such as of $SiO_2$ may be provided on the second reflecting layer 54. By doing so, change of properties of the first reflecting layer 53 and the second reflecting layer 54 can be prevented to improve the durability of the reflecting layers.

In the above-described exemplary embodiment, the second reflecting layer 54 is configured to be formed on the first reflecting layer 53. However, the first reflecting layer 53 may be formed from a material having a high reflectance with respect to laser beams used for removal of portions of the phosphor material during the formation of the wavelength conversion layer 60, and in this case, the second reflecting layer 54 can be omitted. This configuration can also prevent the semiconductor structure layer 37 from being damaged during the removal step of the phosphor material during the formation of the wavelength conversion layer 60. Furthermore, even when the first reflecting layer 53 has not so high reflectance with respect to the excitation light from the light-emitting layer 33, if the first reflecting layer 53 is formed from a material that does not transmit the emission light, the amount of the excitation light emitted through the peripheral area of the top surface of the light-emitting elements 30 can be reduced. This configuration can prevent the color unevenness of the light-emitting device.

In the above-described exemplary embodiment, the number of the light-emitting elements 30 included in the light-emitting device 10 is 9 which are arranged in a 3×3 matrix form. However, the number and the arrangement pattern of the light-emitting elements 30 are not limited thereto. The arrangement of the electrodes for the respective light-emitting elements is also not limited to that in the above-described exemplary embodiment, and can be appropriately modified in accordance with the intended purpose.

In the above-described exemplary embodiment, three light-emitting elements 30 disposed in line and connected in series within the matrix are simultaneously driven, but the way of connection and driving of the light-emitting elements 30 is not also limited thereto. All the light-emitting elements 30 may be connected in series. Further, the light-emitting elements 30 may be driven individually.

In the above-described exemplary embodiment, the wavelength conversion layer 60 is formed from a phosphor material containing YAG phosphor ($Y_3Al_5O_{12}:Ce^{3+}$) particles in a silicone binder resin, but the wavelength conversion layer 60 may be formed from any typical phosphor material other than this. The binder resin may also be any typical binder resin other than a silicone resin, such as an epoxy resin. Examples of other phosphor material may include ortho-silicate-based phosphor (($Sr,Ba,Ca)_2SiO_4$: $Eu^{2+}$), and oxynitride-based phosphor ($\beta$ sialon, $(Si,Al)_6(O,N)_8:Eu^{2+}$).

In the above-described exemplary embodiment, grooves are formed in the semiconductor structure layer 37 formed on the growth substrate 61, and then the semiconductor structure layer 37 and the base 20 are bonded to arrange the light-emitting elements 30 on the base 20 in a matrix form, but it is not limitative and any arrangement method for the light-emitting elements 30 may be adopted. For example, individually separated light-emitting elements 30 are mounted on a base 20 using a collet, and then a wavelength conversion layer 60 is provided thereover. In this case, the formation of the first reflecting layer 53 and the second reflecting layer 54 may be performed before or after the mounting of the light-emitting elements 30 on the base 20.

In the above-described exemplary embodiment, the light-transmitting insulation protective film 51 is formed on the surface 31S of the first semiconductor layer 31, but it is not limitative. The first reflecting layer 53 may directly be formed on the first semiconductor layer 31 without the interposition of the insulation protective film 51.

The numerical values, dimensions, materials, etc. in the above-described exemplary embodiment are only for illustration purpose and not limitative, and can be appropriately selected in accordance with the intended purpose and specification of the light-emitting device to be produced.

It will be apparent to those skilled in the art that various modifications and variations can be made in the present invention without departing from the spirit or scope of the present invention. Thus, it is intended that the present invention cover the modifications and variations of the present invention provided they come within the scope of the appended claims and their equivalents. All related art references described above are hereby incorporated in their entirety by reference.

What is claimed is:

1. A method of producing a light-emitting device, the method comprising:
    disposing a plurality of light-emitting elements on a surface of a supporting substrate, each of the light-emitting elements including a second semiconductor layer, a light-emitting layer, and a first semiconductor layer in this order from a side of the supporting substrate, and further including a hole portion formed to protrude in the first semiconductor layer;
    forming a reflecting layer on a surface of the first semiconductor layer of each of the respective light-emitting elements along peripheries of the light-emitting elements facing an area between the light-emitting elements;
    forming a wavelength conversion layer so as to embed the plurality of light-emitting elements therein on the supporting substrate; and
    irradiating the wavelength conversion layer with laser beams to remove the wavelength conversion layer disposed at the area between the light-emitting elements,
    wherein the supporting substrate includes a first electrode configured to be electrically connected to the first semiconductor layer via the hole portion and a second electrode configured to be electrically connected to the second semiconductor layer.

2. The method according to claim 1, wherein:
    the reflecting layer comprises a first reflecting layer and a second reflecting layer, and
    the forming the reflecting layer comprises:
        forming the first reflecting layer on each of the respective light-emitting elements, the first reflecting layer being configured to reflect light emitted from the light-emitting element; and
        forming the second reflecting layer on the first reflecting layer, the second reflecting layer being configured to reflect the laser beams.

3. The method according to claim 2, wherein the forming the reflecting layer further includes forming an adhesion layer on the first reflecting layer, the adhesion layer being configured to adhere the first reflecting layer and the second reflecting layer to each other.

4. The method according to claim 1, wherein the forming the reflecting layer further includes forming a protective layer on a surface of the reflecting layer.

5. The method according to claim 2, wherein the forming the reflecting layer further includes forming a protective layer on a surface of the second reflecting layer.

6. The method according to claim 3, wherein the forming the reflecting layer further includes forming a protective layer on a surface of the second reflecting layer.

* * * * *